United States Patent
Sawaki et al.

(10) Patent No.: US 8,368,058 B2
(45) Date of Patent: Feb. 5, 2013

(54) PHOTOELECTRIC CONVERSION ELEMENT AND IMAGING DEVICE

(75) Inventors: Daigo Sawaki, Kanagawa (JP); Tetsuro Mitsui, Kanagawa (JP)

(73) Assignee: Fujifilm Corporation (JP)

( * ) Notice: Subject to any disclaimer, the term of this patent is extended or adjusted under 35 U.S.C. 154(b) by 230 days.

(21) Appl. No.: 12/868,321

(22) Filed: Aug. 25, 2010

(65) Prior Publication Data

US 2011/0049492 A1 Mar. 3, 2011

(30) Foreign Application Priority Data

Aug. 28, 2009 (JP) ................................ P2009-199047
Mar. 30, 2010 (JP) ................................ P2010-079923

(51) Int. Cl.
*H01L 35/24* (2006.01)
*H01L 51/00* (2006.01)
*H01L 31/0328* (2006.01)
*H01L 31/062* (2006.01)
*H01L 31/075* (2006.01)

(52) U.S. Cl. .......... 257/40; 257/292; 257/184; 257/458; 257/463

(58) Field of Classification Search .................... 257/40, 257/21, 431, 458, 462, 233, 292, 293, 463, 257/453, 464, 461, 290, 291, 257, 184
See application file for complete search history.

(56) References Cited

U.S. PATENT DOCUMENTS

| | | | |
|---|---|---|---|
| 2002/0176649 A1 | 11/2002 | Bao et al. | |
| 2005/0062130 A1* | 3/2005 | Ciancio et al. | 257/532 |
| 2005/0217722 A1 | 10/2005 | Komatsu et al. | |
| 2007/0120045 A1* | 5/2007 | Yokoyama | 250/214 R |
| 2007/0205477 A1 | 9/2007 | Yokoyama | |
| 2007/0228503 A1* | 10/2007 | Yokoyama | 257/431 |
| 2008/0035965 A1 | 2/2008 | Hayashi et al. | |
| 2009/0293954 A1* | 12/2009 | Yamazaki | 136/258 |
| 2010/0187501 A1* | 7/2010 | Toda | 257/21 |

FOREIGN PATENT DOCUMENTS

| | | |
|---|---|---|
| EP | 1 970 959 A2 | 9/2008 |
| JP | 59-119980 A | 7/1984 |
| JP | 01-034509 | 7/1989 |
| JP | H2-235377 A | 9/1990 |
| JP | H3-171769 A | 7/1991 |
| JP | 2002-368251 A | 12/2002 |
| JP | 2005-294303 A | 10/2005 |
| JP | 2007-273945 A | 10/2007 |
| JP | 2008-072090 A | 3/2008 |
| WO | 00/69625 A1 | 11/2000 |

OTHER PUBLICATIONS

Japanese Office Action "Notification of Reasons for Refusal" dated Aug. 24, 2010; Japanese Patent Application No. 2010-079923 with English Translation.

(Continued)

*Primary Examiner* — Chuong A. Luu
(74) *Attorney, Agent, or Firm* — Studebaker & Brackett PC; Donald R. Studebaker

(57) ABSTRACT

A photoelectric conversion element includes, in the following order: a substrate; a lower electrode containing titanium nitride; an organic layer including a photoelectric conversion layer; and an upper electrode containing a transparent electrode material.

18 Claims, 5 Drawing Sheets

OTHER PUBLICATIONS

Masayuki Hayashi et al.; CMOS Color Image Sensor with Overlaid Organic Photoelectric Conversion Layers; Depression of Dark Current; Journal of the Society of Photographic Science and Technology of Japan, 2008, vol. 71, No. 2, pp. 75-80; with abstract.

Japanese Office Action "Notification of Reasons for Refusal" dated Feb. 1, 2011; Japanese Patent Application No. 2010-079923 with translation.

The Extended European Search Report dated Jan. 19, 2012; EP Application No./ Patent No. 10174286.4-1235 / 2290723.

* cited by examiner

PHOTOELECTRIC CONVERSION ELEMENT AND IMAGING DEVICE

FIELD OF THE INVENTION

The present invention relates to a photoelectric conversion element and an imaging device.

BACKGROUND OF THE INVENTION

A solid-state imaging apparatus (a so-called CCD sensor or CMOS sensor) is widely known as an image sensor used in a digital still camera, a digital video camera, a cell-phone camera, an endoscopic camera and the like. In the solid-state imaging apparatus, photodiode-containing pixels are arranged on a semiconductor substrate such as silicon chip, and signal charges corresponding to photoelectrons generated in the photodiode of each pixel are acquired through a CCD or CMOS reading circuit.

In the solid-state imaging apparatus, not only photodiodes but also signal reading circuits and multilayer interconnections connected thereto are formed in each pixel on a semiconductor substrate. Therefore, the progress of pixel miniaturization is accompanied by a problem of causing a phenomenon that the circuit/interconnection region occupying in one pixel is relatively increased to decrease the light-receiving area of the photodiode, that is, "reduction in the aperture ratio". The reduction in the aperture ratio leads to a decrease in the light sensitivity during imaging.

To solve such a problem, JP-B-1-34509 (the term "JP-B" as used herein means an "examined published Japanese patent application") has proposed a so-called stacked solid-state imaging apparatus where a photoelectric conversion layer is stacked above a semiconductor substrate having formed thereon respective circuits and interconnections and the aperture ratio is thereby increased. For example, the imaging apparatus has a configuration such that a large number of photoelectric conversion elements each containing a pixel electrode formed on a semiconductor substrate, a photoelectric conversion layer formed on the pixel electrode and a counter electrode formed on the photoelectric conversion layer are arranged on a plane parallel to the semiconductor substrate. Incidentally, the pixel electrode and the counter electrode are sometimes referred to as a lower electrode and an upper electrode, respectively. In the photoelectric conversion element, an exciton generated in the photoelectric conversion layer upon application of a bias voltage between the pixel electrode and the counter electrode is dissociated into electrons and holes, and signals in proportion to electron or hole charges moved to the pixel electrode according to the bias voltage are acquired through a CCD or CMOS reading circuit provided in the semiconductor substrate.

The photoelectric conversion element is a device where an electric charge is produced in a photoelectric conversion layer according to light incident from the side of a transparent electrode having light transmittance out of a pair of electrodes and the produced electric charge is read as a signal charge from an electrode. As for such a photoelectric conversion element, those described in JP-A-2008-72090 (the term "JP-A" as used herein means an "unexamined published Japanese patent application") and JP-A-2007-273945 are known.

In JP-A-2008-72090 and JP-A-2007-273945, the photoelectric conversion layer is composed of an organic semiconductor, making it possible to form a thin photoelectric conversion layer while ensuring a large absorption coefficient, whereby less diffusion of an electric charge into the adjacent pixel and reduction in the optical color mixing and electrical color mixing (crosstalk) can be achieved.

JP-A-2008-72090 describes a photoelectric conversion element where a pixel electrode is produced on a transparent substrate such as glass and a transparent electrically conductive oxide (TCO) is used for the material of the pixel electrode.

SUMMARY OF THE INVENTION

However, the configuration of providing a pixel electrode composed of TCO or the like on a transparent substrate such as glass is found to suffer from a decrease in the adherence between the pixel electrode and an organic layer containing a photoelectric conversion layer.

The cause for a decrease in the adherence is not clearly known, but it is presumed that (1) surface unevenness of the pixel electrode and (2) a step in the edge part of the pixel electrode are involved.

Also, difference in the coefficient of thermal expansion between the pixel electrode and the organic layer causes the dark current to increase due to heat in a heat treatment at the production, which gives rise to serious deterioration of S/N, and in this respect, there is room for improvement.

An object of the present invention is to provide a photoelectric conversion element and an imaging device each succeeded in enhancing the adherence between a pixel electrode and an organic material and suppressing the increase of dark current.

The above-described object of the present invention can be attained by a photoelectric conversion element comprising, in the following order, a substrate, a lower electrode, an organic layer containing a photoelectric conversion layer, and an upper electrode containing a transparent electrode material, wherein the lower electrode contains titanium nitride.

The present inventors have found that when a photoelectric conversion element having, between a lower electrode and an upper electrode, an organic layer containing a photoelectric conversion layer is in a configuration of providing a lower electrode containing titanium nitride on the substrate, the adherence between the lower electrode and the organic layer containing a photoelectric conversion layer is enhanced as compared with a case of producing TCO on a glass substrate.

Also, it has been found that the configuration in which a lower electrode composed of titanium nitride is provided on a substrate enables enhancing the heat resistance and suppressing the increase of dark current.

According to the present invention, a photoelectric conversion element and an imaging device each succeeded in enhancing the adherence between a pixel electrode and an organic material and suppressing the increase of dark current can be provided.

DETAILED DESCRIPTION OF THE INVENTION

Figure 1:
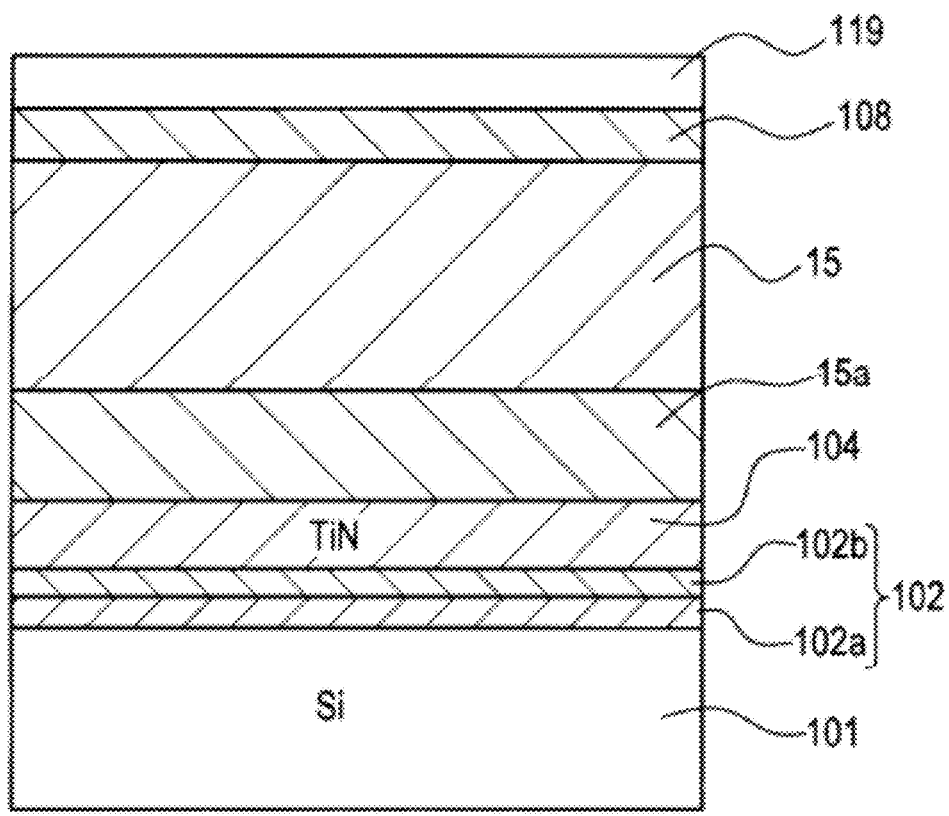
FIG. 1 is a cross-sectional schematic view showing one configuration example of the photoelectric conversion element.

According to the photoelectric conversion element comprising, in the following order, a substrate, a lower electrode, an organic layer containing a photoelectric conversion layer, and a lower electrode containing a transparent electrode material, which is a photoelectric conversion element having a configuration in which the lower electrode contains titanium nitride, the adherence between the lower electrode and the organic layer can be enhanced and the increase of dark current can be suppressed.

The configuration of the photoelectric conversion element is specifically described.

(Lower Electrode)

As for the material of the lower electrode, a metal such as aluminum and gold or a metal oxide typified by ITO is generally used. In this configuration, titanium nitride (TiN) is further contained in the lower electrode, whereby flatness and adherence are improved and the dark current at heating is significantly suppressed.

The content of titanium nitride in the lower electrode is, on a weight basis, preferably 70% or more, more preferably 90% or more. If the content of titanium nitride is less than 70%, the electrical conductivity decreases.

Titanium oxide is often contained due to introduction of oxygen into titanium nitride. In the present invention, the content of titanium oxide is preferably 10% or less, more preferably 5% or less. If the content of titanium oxide exceeds 10%, the electrical conductivity decreases.

The stoichiometric composition of titanium nitride is $Ti_3N_4$, but from an analytical viewpoint, this stoichiometric composition can be changed. It has been found that the ratio of N atom to Ti atom is correlated with the adherence to organic layer and the work function. In consideration of adherence to the organic layer and work function, the ratio is preferably from 1 to 3.9 mol of N atom per 3 mol of Ti atom, more preferably from 2 to 3.8 mol of N atom per 3 mol of Ti atom. When the ratio is 3.9 mol or less of N atom per 3 mol of Ti atom, the adherence is enhanced, and when the ratio is 2 mol or more of N atom per 3 mol of Ti atom, the work function becomes small and can be kept from coming close to 4.3 eV that is the work function of Ti atom. The photoelectric conversion element of this configuration example is preferably configured to let light be incident from the upper electrode side, let electrons generated in the photoelectric conversion layer be collected on the upper electrode side, and let holes be collected on the lower electrode side. At this time, a built-in electric field is caused to be applied due to difference between the work function on the upper electrode side and the work function on the lower electrode side. It is generally known that when a transparent electrically conductive material is used for the upper electrode side, the work function is as relative large as from about 4.6 to 5.4 eV (see, for example, *J. Vac. Sci. Technol. A*17(4), July/August 1999, pp. 1765-1772, FIG. 12). Therefore, the material used for the lower electrode preferably has a work function of about 4.6 eV or more, more preferably 4.7 eV or more.

The work function can be made to be 4.6 eV or more by the compositional ratio between nitrogen and titanium of titanium nitride in the lower electrode.

The method for depositing the titanium nitride-containing lower electrode includes a vapor deposition method, a sputtering method, a CVD method and the like, but it is most preferred to use a CVD method based on the compositional ratio between nitrogen and titanium of titanium nitride in the lower electrode.

In the case where the lower electrode is a plurality of pixel electrodes divided for each pixel, a pronounced effect of enhancing the adherence of the plurality of pixel electrodes to the organic layer is brought out. In this case, the lower electrode takes a configuration where in planar view (a state of viewing the substrate surface from the light indent side), a plurality of square pixel electrodes are arranged like tiles according to the positions of pixels. The plurality of pixel electrodes are one-dimensionally or two-dimensionally arranged but is preferably two-dimensionally arranged.

The demand for a larger number of pixels and a lower cost of an image sensor is strong, and reduction in the side length of a pixel is proceeding even at present. As a result, it becomes difficult for the conventional image sensor using an Si photodiode to effectively guide light to the photodiode that is the light-receiving part. In particular, this problem is serious when the side length of a pixel is less than 2 μm. This problem can be avoided because the organic layer is located above a reading circuit and a large opening is ensured, and the side length of the pixel electrode is preferably 3 μm or less, more preferably 1.5 μm or less. Accordingly, even when with the further progress of miniaturization, the side length of a pixel becomes less than 2 μm, particularly about 1 μm, there arises practically no problem. The distance between pixel electrodes is preferably 1.0 μm or less, more preferably 0.3 μm or less.

The thickness of the pixel electrode is related to the electric resistance and flatness and for reducing the electric resistance, the thickness needs to be increased, which, however, brings about a decrease in the flatness. In consideration of electric resistance and flatness, the thickness of the pixel electrode is preferably 100 nm or less, more preferably 30 nm or less.

The surface roughness of the pixel electrode is related to the adherence and when the surface of the pixel electrode is rough, joining at the interface between the pixel electrode and the organic layer becomes weak and the adherence decreases. It has been found that the flatness is improved by containing titanium nitride. Improved flatness enables enhancing the adherence and obtaining a remarkable effect of suppressing an increase of dark current at heating. In the present invention, the average surface roughness of the pixel electrode is preferably 1 nm or less, more preferably 0.6 nm or less.

The tilt angle in the edge part of the pixel electrode with respect to the substrate surface is also related to the adherence. It has been confirmed that when this tilt angle is an obtuse angle, the adherence decreases. In consideration of the results, the tilt angle in the edge part of the pixel electrode is preferably from 10 to 80°, more preferably from 20 to 80°, with respect to the substrate surface.

The method for patterning the pixel electrode includes two methods, that is, wet etching which is an anisotropic etching using chemicals, and dry etching which is an isotropic etching using plasma. In the wet etching, since a solution is used, etching cannot be performed isotropically, and the tilt angle in the edge part of the pixel electrode can be hardly made acute. Accordingly, as the optimal method, patterning is preferably performed by dry etching that can effect isotropic etching and make the tilt angle acute.

(Substrate)

The substrate is composed of single-crystal silicon. On the surface in the lower electrode side of the substrate, an insulating layer is formed. It has been found that by using a substrate containing single-crystal silicon, the average surface roughness on the pixel electrode is improved and this enables enhancing the adherence and significantly suppressing the dark current at heating. Silicon oxide is preferably contained in the insulating layer, and it is more preferred to contain silicon nitride in the insulating layer.

(Organic Layer)

In the photoelectric conversion element of this configuration, the organic layer is composed of a charge blocking layer for suppressing injection of an electric charge from the lower electrode, and a photoelectric conversion layer.

In order to increase the light absorptance in the photoelectric conversion layer, the film thickness needs to be made large, but if the film thickness is excessively large, a larger amount of voltages is required to collect electric charges. In consideration of light absorptance, low bias voltage and the like, the film thickness of the organic layer is preferably 1 μm or less, more preferably 800 nm or less, still more preferably 600 nm or less, and most preferably 400 nm or less.

It has been newly found that in addition to the above-described correlation between the flatness of the lower electrode and the adhesion, there is a correlation also between the molecular weight of the organic compound in the organic layer in direct contact with the lower electrode and the adherence. In general, when the molecular weight of the organic compound in the organic layer is large, the glass transition temperature (Tg) rises and the heat resistance is enhanced, but if the molecular weight is excessively large, the adherence to the lower electrode is decreased. When the molecular weight is increased, the glass transition temperature (Tg) rises, but the grain size tends to become large and the flatness of the film surface decreases. This is considered to incur reduction in the contact performance with the lower electrode and worsening of the adherence. In consideration of heat resistance and adherence to the lower electrode, the molecular weight of the organic compound in the organic layer in direct contact with the lower electrode is preferably from 400 to 1,300, more preferably from 450 to 1,200, still more preferably from 500 to 1,100.

The photoelectric conversion layer contains a p-type organic semiconductor and an n-type organic semiconductor. The p-type organic semiconductor and the n-type organic semiconductor are joined to form a donor-acceptor interface, whereby the exciton dissociation efficiency can be increased. Accordingly, the photoelectric conversion layer in the configuration of a p-type organic semiconductor and an n-type organic semiconductor being joined exhibits a high photoelectric conversion efficiency. In particular, a photoelectric conversion layer where a p-type organic semiconductor and an n-type organic semiconductor are mixed is preferred, because the joint interface is increased and the photoelectric conversion efficiency is enhanced.

The p-type organic semiconductor (compound) is a donor-type organic semiconductor (compound) and indicates an organic compound having a property of readily donating an electron, mainly typified by a hole-transporting organic compound. More specifically, this is an organic compound having a smaller ionization potential when two organic materials are used in contact with each other. Accordingly, the donor-type organic compound may be any organic compound as long as it is an organic compound having an electron donating property. Examples of the compound which can be used include a triarylamine compound, a benzidine compound, a pyrazoline compound, a styrylamine compound, a hydrazone compound, a triphenylmethane compound, a carbazole compound, a polysilane compound, a thiophene compound, a phthalocyanine compound, a cyanine compound, a merocyanine compound, an oxonol compound, a polyamine compound, an indole compound, a pyrrole compound, a pyrazole compound, a polyarylene compound, a fused aromatic carbocyclic compound (e.g., naphthalene derivative, anthracene derivative, phenanthrene derivative, tetracene derivative, pyrene derivative, perylene derivative, fluoranthene derivative), and a metal complex having a nitrogen-containing heterocyclic compound as a ligand. The donor-type organic semiconductor is not limited to these compounds and, as described above, any organic compound having an ionization potential smaller than that of the organic compound used as an n-type (acceptor) compound may be used as the donor-type organic semiconductor.

The n-type organic semiconductor (compound) is an acceptor-type organic semiconductor (compound) and indicates an organic compound having a property of readily accepting an electron, mainly typified by an electron-transporting organic compound. More specifically, the n-type organic semiconductor is an organic compound having a larger electron affinity when two organic compounds are used in contact with each other. Accordingly, for the acceptor-type organic compound, any organic compound can be used as long as it is an organic compound having an electron accepting property. Examples thereof include a fused aromatic carbocyclic compound (e.g., naphthalene derivative, anthracene derivative, phenanthrene derivative, tetracene derivative, pyrene derivative, perylene derivative, fluoranthene derivative), a 5- to 7-membered heterocyclic compound containing a nitrogen atom, an oxygen atom or a sulfur atom (e.g., pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyralidine, pyrrolopyridine, thiadiazolopyridine, dibenzazepine, tribenzazepine), a polyarylene compound, a fluorene compound, a cyclopentadiene compound, a silyl compound, and a metal complex having a nitrogen-containing heterocyclic compound as a ligand. The acceptor-type organic semiconductor is not limited to these compounds and, as described above, any organic compound having an electron affinity larger than that of the organic compound used as the donor-type organic compound may be used as the acceptor-type organic semiconductor.

As for the p-type organic semiconductor or n-type organic semiconductor, any organic dye may be used, but preferred examples thereof include cyanine dyes, styryl dyes, hemicyanine dyes, merocyanine dyes (including zero-methine merocyanine (simple merocyanine)), trinuclear merocyanine dyes, tetranuclear merocyanine dyes, rhodacyanine dyes, complex cyanine dyes, complex merocyanine dyes, alopolar dyes, oxonol dyes, hemioxonol dyes, squarylium dyes, croconium dyes, azamethine dyes, coumarin dyes, arylidene dyes, anthraquinone dyes, triphenylmethane dyes, azo dyes, azomethine dyes, spiro compound, metallocene dyes, fluorenone dyes, flugide dyes, perylene dyes, perinone dyes, phenazine dyes, phenothiazine dyes, quinone dyes, diphenylmethane dyes, polyene dyes, acridine dyes, acridinone dyes, diphenylamine dyes, quinacridone dyes, quinophthalone dyes, phenoxazine dyes, phthaloperylene dyes, diketopyrrolopyrrole dyes, dioxane dyes, porphyrin dyes, chlorophyll dyes, phthalocyanine dyes, metal complex dyes, and fused aromatic carbocyclic dyes (e.g., naphthalene derivative, anthracene derivative, phenanthrene derivative, tetracene derivative, pyrene derivative, perylene derivative, fluoranthene derivative).

As for the n-type organic semiconductor, a fullerene or fullerene derivative excellent in the electron transportability is preferably used. The fullerene indicates fullerene $C_{60}$, fullerene $C_{70}$, fullerene $C_{76}$, fullerene $C_{78}$, fullerene $C_{80}$, fullerene $C_{82}$, fullerene $C_{84}$, fullerene $C_{90}$, fullerene $C_{96}$, fullerene $C_{240}$, fullerene $C_{540}$, a mixed fullerene or a fullerene nanotube, and the fullerene derivative indicates a compound obtained by adding a substituent to such a fullerene.

The substituent of the fullerene derivative is preferably an alkyl group, an aryl group or a heterocyclic group. The alkyl group is preferably an alkyl group having carbon number of 1 to 12, and the aryl group and heterocyclic group are preferably a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a benzimidazole ring, an imidazopyridine ring, a quinolidine ring, a quinoline ring, a phthalazine ring, a naphthylidine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiine ring, a phenothiazine ring or a phenazine ring, more preferably a benzene ring, a naphthalene ring, an anthracene ring, a phenanthrene ring, a pyridine ring, an imidazole ring, an oxazole ring or a thiadiazole ring, still more preferably a benzene ring, a naphthalene ring or a pyridine ring. These may further have a substituent, and the substituent may combine, if possible, to form a ring. Incidentally, these groups each may have a plurality of substituents, and the substituents may be the same or different. Also, a plurality of substituents may combine, if possible, to form a ring.

By virtue of containing a fullerene or a fullerene derivative in the photoelectric conversion layer, an electron generated by photoelectric conversion can be rapidly transported to the lower electrode or upper electrode through a fullerene molecular or a fullerene derivative molecule. When fullerene molecules or fullerene derivative molecules are in a state of being connected to form an electron channel, the electron transportability is enhanced and high-speed responsivity of the photoelectric conversion element can be realized. For this purpose, the fullerene or fullerene derivative is preferably contained in an amount of 40% or more by volume in the photoelectric conversion layer. However, if the fullerene or fullerene derivative is contained in an excessively large amount, the proportion of the p-type semiconductor decreases and the joint interface becomes small, which leads to a decrease in the exciton dissociation efficiency.

In the photoelectric conversion layer, when the triarylamine compound described in Japanese Patent 4,213,832 is used as the p-type organic semiconductor mixed together with the fullerene or fullerene derivative, the photoelectric conversion element can exhibit a high SN ratio, and this is more preferred. In particular, a structure having a substituent at the P-position of the triarylamine structure is preferred. The substituent may combine, if possible, to form a ring. The compound may have a plurality of substituents, and these substituents may be the same or different. Also, the plurality of substituents may combine, if possible, to form a ring. If the ratio of the fullerene or fullerene derivative in the photoelectric conversion layer is excessively large, the proportion of the triarylamine compound becomes small and the amount of incident light absorbed decreases, as a result, the photoelectric conversion efficiency is reduced. Therefore, the content of the fullerene or fullerene derivative in the photoelectric conversion layer is preferably 85% or less by volume.

For the electron blocking layer, an electron-donating organic material can be used. Specific examples of the material which can be used include, as a low molecular material, an aromatic diamine compound such as N,N'-bis(3-methylphenyl)-(1,1'-biphenyl)-4,4'-diamine (TPD) and 4,4'-bis[N-(naphthyl)-N-phenyl-amino]biphenyl (α-NPD), oxazole, oxadiazole, triazole, imidazole, imidazolone, a stilbene derivative, a pyrazoline derivative, tetrahydroimidazole, a polyarylalkane, butadiene, 4,4',4''-tris(N-(3-methylphenyl) N-phenylamino)triphenylamine (m-MTDATA), a porphyrin compound such as porphin, copper tetraphenylporphin, phthalocyanine, copper phthalocyanine and titanium phthalocyanine oxide, a triazole derivative, an oxadiazole derivative, an imidazole derivative, a polyarylalkane derivative, a pyrazoline derivative, a pyrazolone derivative, a phenylenediamine derivative, an anilamine derivative, an amino-substituted chalcone derivative, an oxazole derivative, a styrylanthracene derivative, a fluorenone derivative, a hydrazone derivative, a silazane derivative, a phenanthroline derivative, a carbazole derivative and a fluorene derivative, with a phenanthroline derivative, a carbazole derivative and a fluorene derivative being preferred. As a polymer material, a polymer such as phenylenevinylene, fluorene, carbazole, indole, pyrene, pyrrole, picolin, thiophene, acetylene and diacetylene, and a derivative thereof can be used. A compound having a sufficient hole transportability may be used even if it is not an electron-donating compound.

An inorganic material may also be used for the charge blocking layer. An inorganic material is generally larger in the dielectric constant than an organic material and therefore, when used for the charge blocking layer 15a, this allows for supply of a large amount of voltages to the photoelectric conversion layer, as a result, the photoelectric conversion efficient can be elevated. Examples of the material that can work out to the charge blocking layer include calcium oxide, chromium oxide, chromium copper oxide, manganese oxide, cobalt oxide, nickel oxide, copper oxide, gallium copper oxide, strontium copper oxide, niobium oxide, molybdenum oxide, indium copper oxide, indium silver oxide and iridium oxide. More preferred examples include cerium oxide and tin oxide.

The charge blocking layer may be composed of a plurality of layers. In this case, out of the plurality of layers, the layer adjacent to the photoelectric conversion layer is preferably a layer composed of the same material as the p-type organic semiconductor contained in the photoelectric conversion layer. Use of the same p-type organic semiconductor also for the charge blocking layer makes it possible to prevent the formation of an intermediate level at the interface between the photoelectric conversion layer and the layer adjacent thereto and more reduce the dark current.

In the case where the charge blocking layer is a single layer, the layer may be a layer composed of an inorganic material, and in the case of a plurality of layers, one layer or two or more layers can be a layer composed of an inorganic material.

(Upper Electrode)

In order to allow light to enter the organic layer containing a photoelectric conversion layer, the upper electrode is preferably composed of a transparent electrically conductive film. Examples of the material therefor include a metal, a metal oxide, a metal nitride, a metal sulfide, an organic electrically conductive compound, and a mixture thereof. Specific examples include an electrically conductive metal oxide such as tin oxide, zinc oxide, indium oxide, indium tin oxide (ITO), indium zinc oxide (IZO), indium tungsten oxide (IWO) and titanium oxide, a metal nitride such as titanium nitride, a metal such as gold (Au), platinum (Pt), silver (Ag), chromium (Cr), nickel (Ni) and aluminum (Al), a mixture or laminate of such a metal and such an electrically conductive metal oxide, an organic electrically conductive compound such as polyaniline, polythiophene and polypyrrole, and a laminate thereof with ITO. The material of the transparent electrically conductive film is preferably a transparent electrically conductive oxide, specifically, any one material of ITO, IZO, tin oxide, antimony-doped tin oxide (ATO), fluorine-doped tin oxide (FTO), zinc oxide, antimony-doped zinc oxide (AZO) and gallium-doped zinc oxide (GZO). The material as the transparent electrically conductive oxide is more preferably ITO.

The film thickness of the upper electrode is preferably large so as to reduce the electric resistance. The method for depositing the upper electrode is preferably a sputtering method and when the upper electrode is deposited to a large film thickness, this takes a long time and causes great damage to the organic layer just below the upper electrode. In consideration of damage to the organic layer, the film thickness is preferably from 3 to 100 nm, more preferably from 5 to 50 nm.

The surface resistance of the upper electrode is, in the case of CMOS reading circuit, preferably 10 KΩ/sq or less, more preferably 1 KΩ/sq or less, and in the case of CCD reading circuit, preferably 1 KΩ/sq or less, more preferably 0.1 KΩ/sq or less.

One example of the photoelectric conversion element is described below by referring to the drawings.

FIG. 1 is a cross-sectional view schematically showing one configuration example of the photoelectric conversion element. The photoelectric conversion element shown in FIG. 1 is in the configuration where a substrate 101 composed of single-crystal silicon (Si), an insulating layer 102 formed on the substrate 101, a pixel electrode 104 provided on the insulating layer 102, a charge blocking layer 15a, a photoelectric conversion layer 15, a transparent electrode 108 functioning as an upper electrode are stacked in this order. Here, the photoelectric conversion layer 15 and the charge blocking layer 15a are collectively referred to as the organic layer.

On the upper electrode 108, a protective film 119 composed of silicon oxide (SiO) or the like is formed.

The photoelectric conversion element shown in FIG. 1 is designed to let light be incident from above the transparent upper electrode 108. In the photoelectric conversion element, a bias voltage is applied between the lower electrode 104 and the upper electrode 108 so that out of electric charges (a hole and an electron) generated in the photoelectric conversion layer 15, the hole can move to the upper electrode 108 and the electron can move to the lower electrode 104. In other words, the upper electrode 108 is a hole trapping electrode, and the lower electrode 104 is an electron trapping electrode.

The insulating layer 102 is in the configuration where a thermal oxide film (Th—SiO$_2$) 102a and an interlayer insulating layer (IMD: Inter Metal Dielectric) 102b are stacked in this order on the substrate 101. Incidentally, the configuration of the insulating layer 102 is not limited thereto.

The configuration of the photoelectric conversion element is not limited to that described above.

For example, the upper electrode 108 may serve as an electron trapping electrode, and the lower electrode 104 may serve as a hole trapping electrode.

For example, in the photoelectric conversion element, a layer other than the lower electrode 104, the photoelectric conversion layer 15 and the upper electrode 108 may be further provided.

For example, the charge blocking layer 15a may be provided between the photoelectric conversion layer 15 and the upper electrode 108, or the charge blocking layer 15a may be provided between the pixel electrode 104 and the photoelectric conversion layer 15 and also between the upper electrode 108 and the photoelectric conversion layer 15.

(Relationship Between Adherence of Lower Electrode to Organic Layer and Flatness of Lower Electrode)

Figure 2:
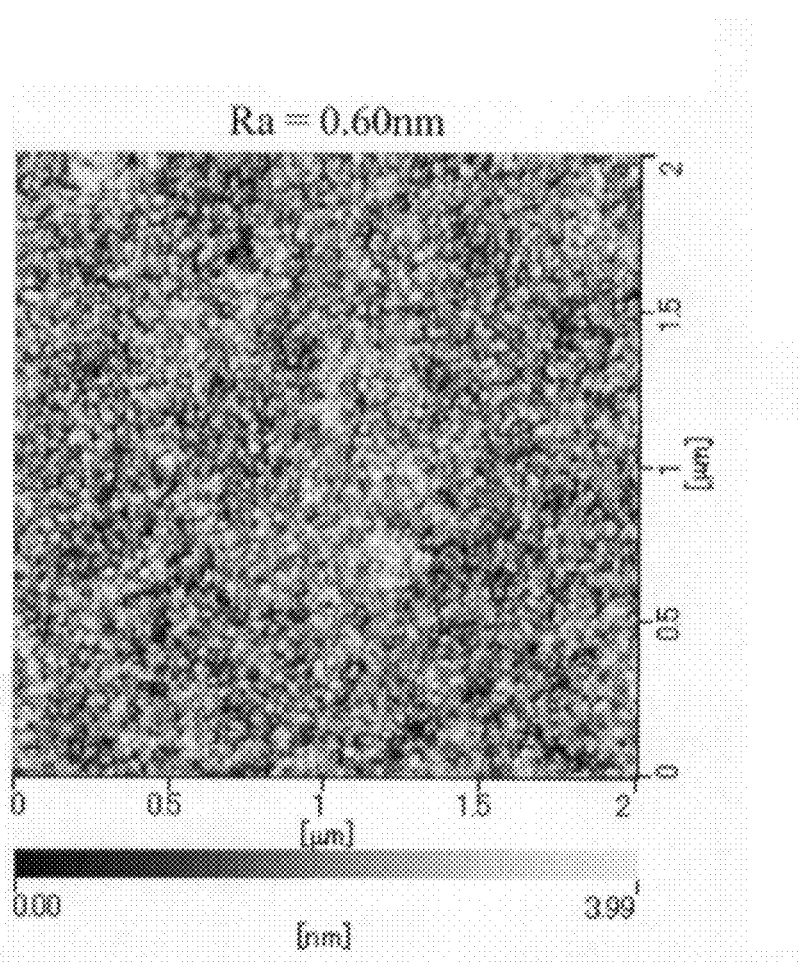
FIG. 2 is an image obtained by photographing the surface of the lower electrode with an atomic force microscope.
Figure 3:
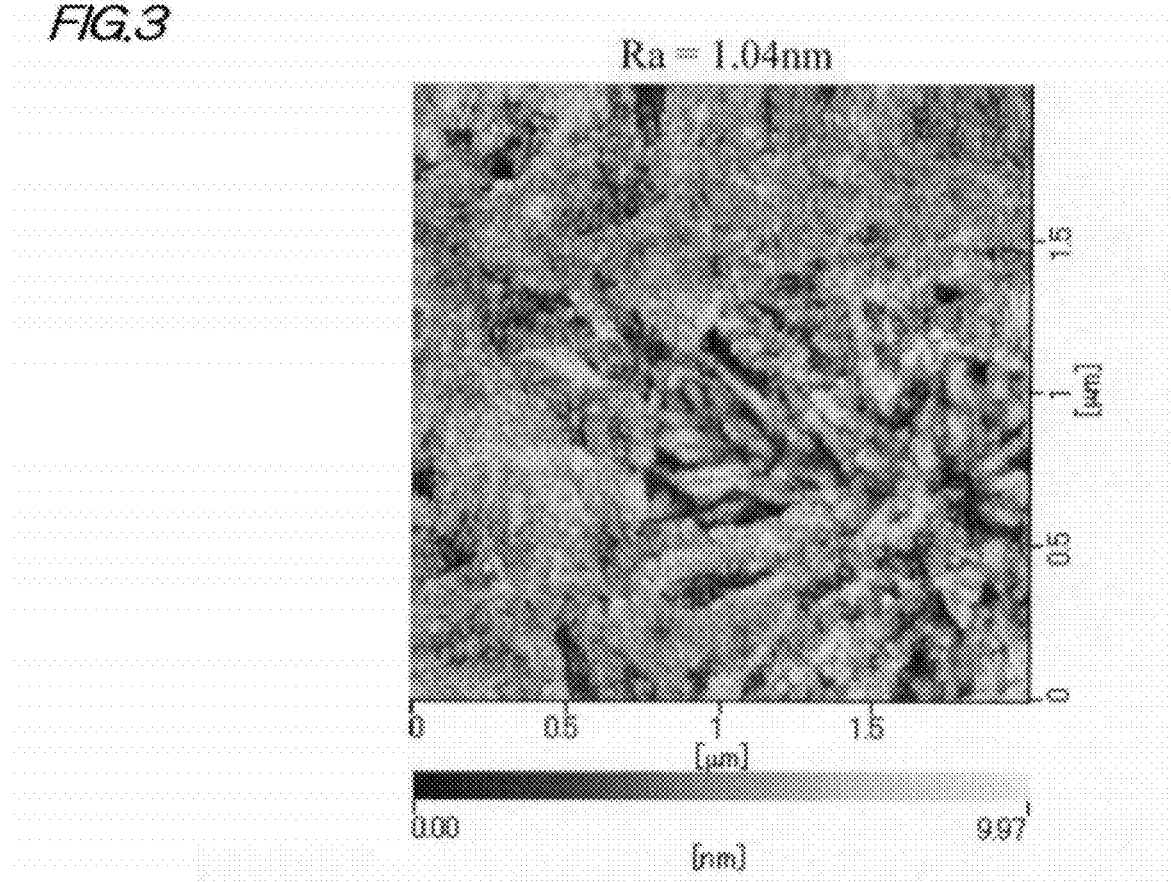
FIG. 3 is an image obtained by photographing the surface of the lower electrode with an atomic force microscope.

FIGS. 2 and 3 each is an image obtained by photographing the surface of the lower electrode with an atomic force microscope (AFM). In both of FIGS. 2 and 3, an insulating layer is formed on a substrate containing single-crystal silicon, and a lower electrode is formed on the insulating layer.

The surface roughness (Ra) of the lower electrode shown in FIG. 2 is 0.60 nm, and the surface roughness (Ra) of the lower electrode shown in FIG. 3 is 1.04 nm, revealing that the lower electrode shown in FIG. 2 is smaller in the surface roughness, that is, more flat, than the lower electrode of FIG. 3. As the surface roughness of the lower electrode is smaller, that is, as the lower electrode is more flat, the adherence to the organic layer in contact with the lower electrode is more enhanced.

(Relationship Between Adherence of Lower Electrode to Organic Layer and Tilt Angle in Edge Part of Lower Electrode)

Figure 4:
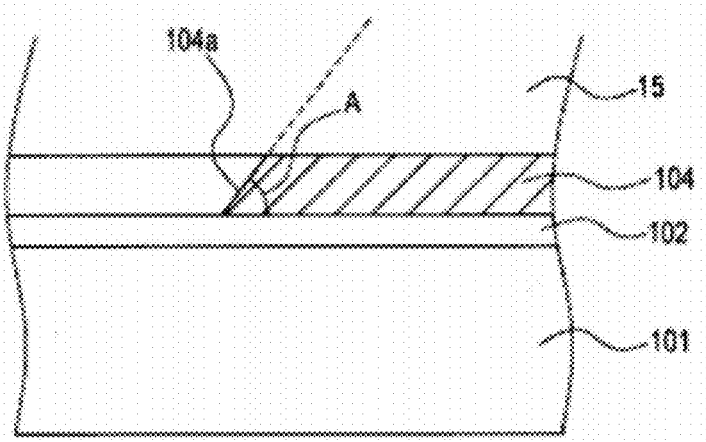
FIG. 4 is a schematic view showing the cross-section of the lower electrode.

FIG. 4 is a schematic view showing the cross-section of the lower electrode. The lower electrode 104 is provided on a silicon substrate 101 through an insulating layer 102. In this configuration, the charge blocking layer 15a of the organic layer is stacked on the insulating layer 102 to cover the lower electrode 104.

In the edge part of the lower electrode 104, a tilted surface 104a is provided. The tilted surface 104a is tilted at an angle A with respect to the surface (containing the insulating layer 102) of the substrate 101. This angle A is defined as the tilt angle in the edge part of the lower electrode.

Figure 5:
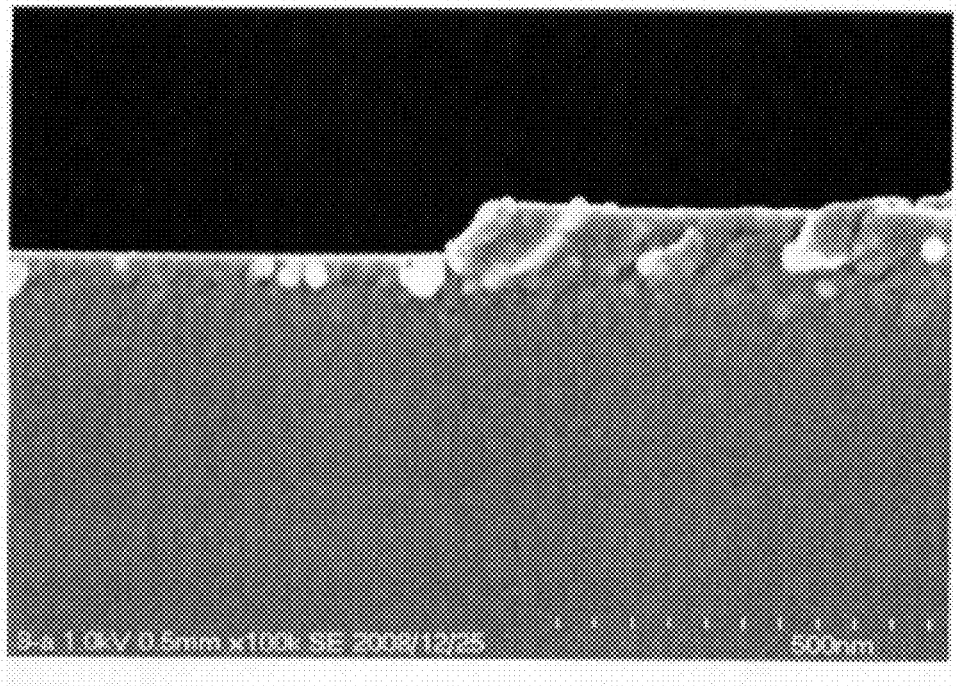
FIG. 5 is an image obtained by photographing the edge part of the pixel electrode with a scanning electron microscope.
Figure 6:
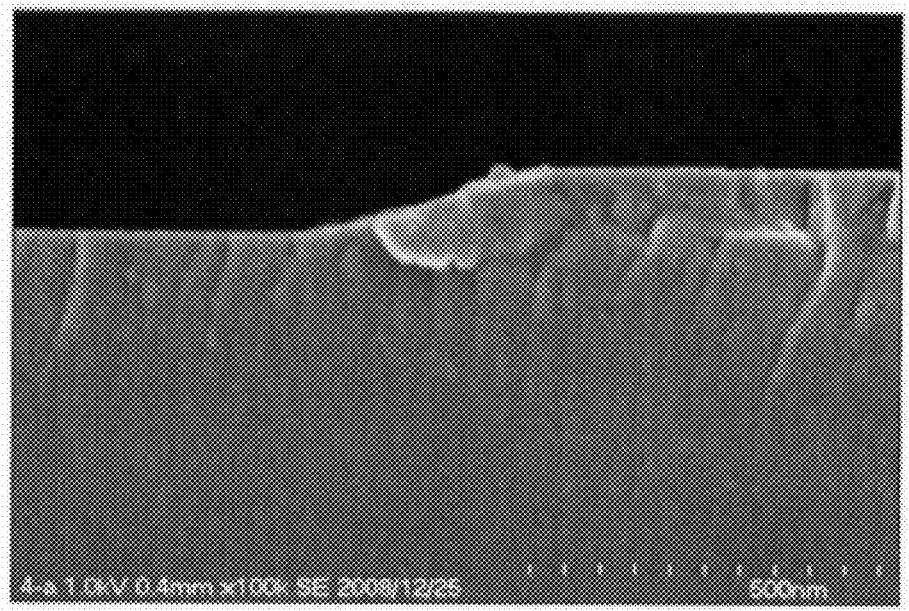
FIG. 6 is an image obtained by photographing the edge part of the pixel electrode with a scanning electron microscope.

FIGS. 5 and 6 each is an image obtained by photographing the edge part of the pixel electrode in the photoelectric conversion element with a scanning electron microscope (SEM). Incidentally, in FIGS. 5 and 6, the edge part of one pixel electrode out of a plurality of pixel electrodes formed by dividing the lower electrode for each pixel is shown.

In the photoelectric conversion element of FIG. 5, an insulating layer is formed on a substrate, and a pixel electrode is formed by dry etching on the insulating layer. In the photoelectric conversion element of FIG. 6, an insulating layer is formed on a silicon substrate, and a pixel electrode is formed by dry etching on the insulating layer. In FIGS. 5 and 6, the blackened region indicates the cross-sectional portion of the organic layer, and the gray region lighter than the region above indicates the cross-sectional portion of the substrate and the pixel electrode provided on the substrate. The edge part of the pixel electrode shown in FIG. 5 is tilted at about 50° with respect to the surface of the substrate. Also, the edge part of the pixel electrode shown in FIG. 6 is tilted at about 20° with respect to the surface of the substrate.

When the edge part of the pixel electrode is configured in a nearly step-shaped manner to have a tilt angle of 50° or more with respect to the substrate as shown in FIG. 5, the adherence between the pixel electrode and the organic layer is enhanced as compared with a configuration in which the entire pixel electrode forms a gentle slope with respect to the substrate as shown in FIG. 6.

In order to confirm how the formation of a pixel electrode composed of titanium nitride on a substrate of a photoelectric conversion element affects the adherence, flatness and dark current, the following measurements were performed.

EXAMPLE 1

An insulating layer containing silicon oxide was formed on a silicon substrate to a film thickness of 200 nm and on the insulating layer, titanium nitride (3.8 mol of N atom per 3 mol of Ti atom) was patterned by dry etching to a thickness of 100 nm to form a pixel electrode. On the pixel electrode, the compound represented by chemical formula 1 (molecular weight: 794) was deposited to a thickness of 100 nm to form an electron blocking layer. Thereafter, the compounds represented by chemical formulae 4, 5 and 6 were co-deposited to a thickness of 400 nm in total to form an organic layer. On the organic layer, ITO as an upper electrode was sputtered to a thickness of 10 nm.

EXAMPLE 2

An insulating layer containing silicon oxide was formed on a silicon substrate to a film thickness of 200 nm and on the insulating layer, titanium nitride (3.8 mol of N atom per 3 mol of Ti atom) was patterned by dry etching to a thickness of 100 nm to form a pixel electrode. On the pixel electrode, the compound represented by chemical formula 2 (molecular weight: 360) was deposited to a thickness of 100 nm to form an electron blocking layer. Thereafter, the compounds represented by chemical formulae 4, 5 and 6 were co-deposited to a thickness of 400 nm in total to form an organic layer. On the organic layer, ITO as an upper electrode was sputtered to a thickness of 10 nm.

EXAMPLE 3

An insulating layer containing silicon oxide was formed on a silicon substrate to a film thickness of 200 nm and on the insulating layer, titanium nitride (3.8 mol of N atom per 3 mol of Ti atom) was patterned by dry etching to a thickness of 100 nm to form a pixel electrode. On the pixel electrode, the compound represented by chemical formula 3 (molecular weight: 1,400) was deposited to a thickness of 100 nm to form an electron blocking layer. Thereafter, the compounds represented by chemical formulae 4, 5 and 6 were co-deposited to a thickness of 400 nm in total to form an organic layer. On the organic layer, ITO as an upper electrode was sputtered to a thickness of 10 nm.

EXAMPLE 4

An insulating layer containing silicon oxide was formed on a silicon substrate to a film thickness of 200 nm and on the insulating layer, titanium nitride (4.0 mol of N atom per 3 mol of Ti atom) was patterned by dry etching to a thickness of 100 nm to form a pixel electrode. On the pixel electrode, the compound represented by chemical formula 1 (molecular weight: 794) was deposited to a thickness of 100 nm to form an electron blocking layer. Thereafter, the compounds represented by chemical formulae 4, 5 and 6 were co-deposited to a thickness of 400 nm in total to form an organic layer. On the organic layer, ITO as an upper electrode was sputtered to a thickness of 10 nm.

EXAMPLE 5

An insulating layer containing silicon oxide was formed on a silicon substrate to a film thickness of 200 nm and on the insulating layer, titanium nitride (3.8 mol of N atom per 3 mol of Ti atom) was patterned by dry etching to a thickness of 200 nm to form a pixel electrode. On the pixel electrode, the compound represented by chemical formula 1 (molecular weight: 794) was deposited to a thickness of 100 nm to form an electron blocking layer. Thereafter, the compounds represented by chemical formulae 4, 5 and 6 were co-deposited to a thickness of 400 nm in total to form an organic layer. On the organic layer, ITO as an upper electrode was sputtered to a thickness of 10 nm.

EXAMPLE 6

An insulating layer containing silicon oxide was formed on a silicon substrate to a film thickness of 200 nm and on the insulating layer, titanium nitride (3.8 mol of N atom per 3 mol of Ti atom) was patterned by wet etching to a thickness of 100 nm to form a pixel electrode. On the pixel electrode, the compound represented by chemical formula 1 (molecular weight: 794) was deposited to a thickness of 100 nm to form an electron blocking layer. Thereafter, the compounds represented by chemical formulae 4, 5 and 6 were co-deposited to a thickness of 400 nm in total to form an organic layer. On the organic layer, ITO as an upper electrode was sputtered to a thickness of 10 nm.

COMPARATIVE EXAMPLE 1

An insulating layer containing silicon oxide was formed on a silicon substrate to a film thickness of 200 nm and on the insulating layer, ITO was patterned by dry etching to a thickness of 100 nm to form a pixel electrode. On the pixel electrode, the compound represented by chemical formula 1 (molecular weight: 794) was deposited to a thickness of 100 nm to form an electron blocking layer. Thereafter, the compounds represented by chemical formulae 4, 5 and 6 were co-deposited to a thickness of 400 nm in total to form an organic layer. On the organic layer, ITO as an upper electrode was sputtered to a thickness of 10 nm.

The configurations of Examples 1 to 6 and Comparative Example 1

(Example 1) Si substrate/TiN (Ti atom: 3 mol, N atom: 3.8 mol) (100) (dry etching)/chemical formula 1 (100) (molecular weight: 794)/chemical formulae 4, 5 and 6 (400)/ITO (10)

(Example 2) Si substrate/TiN (Ti atom: 3 mol, N atom: 3.8 mol) (100) (dry etching)/chemical formula 2 (100) (molecular weight: 360)/chemical formulae 4, 5 and 6 (400)/ITO (10)

(Example 3) Si substrate/TiN (Ti atom: 3 mol, N atom: 3.8 mol) (100) (dry etching)/chemical formula 3 (100) (molecular weight: 1,400)/chemical formulae 4, 5 and 6 (400)/ITO (10)

(Example 4) Si substrate/TiN (Ti atom: 3 mol, N atom: 4.0 mol) (100) (dry etching)/chemical formula 1 (100) (molecular weight: 794)/chemical formulae 4, 5 and 6 (400)/ITO (10)

(Example 5) Si substrate/TiN (Ti atom: 3 mol, N atom: 3.8 mol) (200) (dry etching)/chemical formula 1 (100) (molecular weight: 794)/chemical formulae 4, 5 and 6 (400)/ITO (10)

(Example 6) Si substrate/TiN (Ti atom: 3 mol, N atom: 3.8 mol) (100) (wet etching)/chemical formula 1 (100) (molecular weight: 794)/chemical formulae 4, 5 and 6 (400)/ITO (10)

(Comparative Example 1) ITO (100) (dry etching)/chemical formula 1 (100) (molecular weight: 794)/chemical formulae 4, 5 and 6 (400)/ITO (10)

Chemical formulae used in Examples 1 to 6 and Comparative Example 1 are shown below.

(Chemical Formula 1)

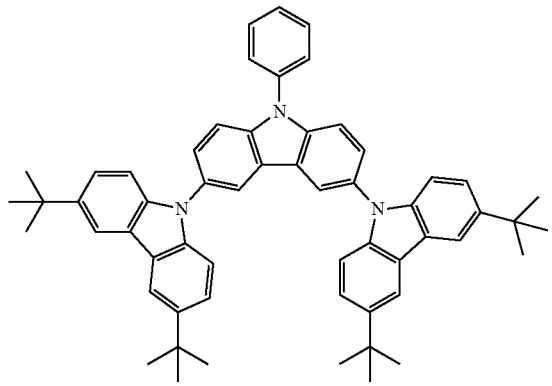

(Chemical Formula 2)

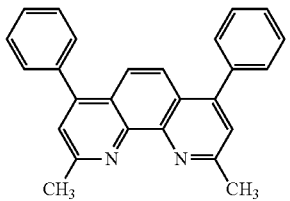

(Chemical Formula 3)

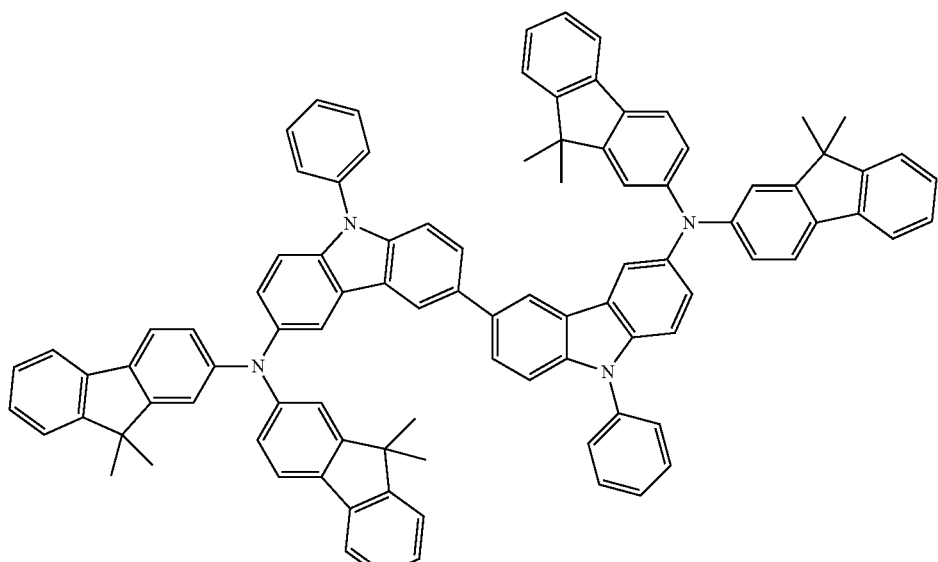

(Chemical Formula 4)

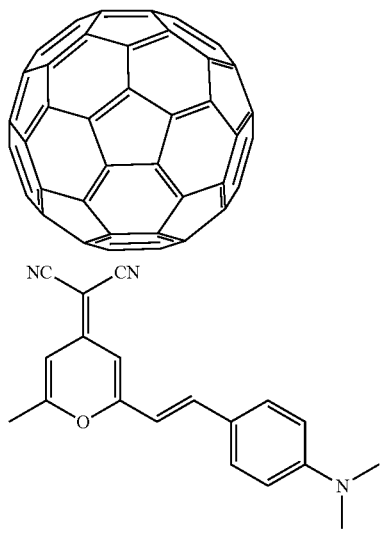

(Chemical Formula 5)

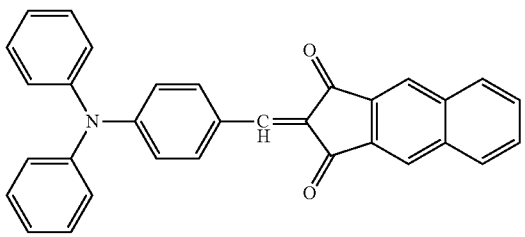

(Chemical Formula 6)

The results of measurements are shown in Table 1. In Table 1, regarding the photoelectric conversion elements of Examples 1 to 6 and Comparative Example 1, the dark current of the photoelectric conversion elements of Examples and Comparative Example, the evaluation of adherence test, the tilt angle in the edge part of the pixel electrode with respect to the substrate surface, and the average surface roughness are shown.

In the measurement of dark current, "Before Heating" indicates a state before heat treatment, and "After Heating" indicates a state when allowed to naturally cool after heat treatment at 180° C. for 3 hours.

In the evaluation of adherence test, separation with Sellotape™ was performed and based on the results, A in the Table indicates no separation, B indicates partial separation, and C indicates complete separation.

In the measurement of dark current, a quantum efficiency measuring apparatus was used. The tilt angle in the edge part of the pixel electrode with respect to the substrate surface was observed using a scanning electron microscope (SEM), and the average surface roughness was observed using an atomic force microscope (AFM).

current is increased. The pixel electrode containing titanium nitride is improved in the average surface roughness, whereby the unevenness is suppressed and the photoelectric conversion layer and the lower electrode are kept from coming into proximity. Even when thermal motion of molecules occurs due to a heat treatment in this state, since the distance between the photoelectric conversion layer and the lower electrode is not shortened, no leakage occurs and the dark current is suppressed.

TABLE 1

| Sample | Pixel Electrode | Film Thickness (nm) | Organic Layer in Contact with Pixel Electrode | Etching Method of Lower Electrode | Dark Current Before Heating | Dark Current After Heating | Evaluation of Separation | Average Surface Roughness of Pixel Electrode (nm) | Tilt Angle in Edge Part of Pixel Electrode |
|---|---|---|---|---|---|---|---|---|---|
| Example 1 | Ti3N3.8 | 100 | chemical formula 1 (molecular weight: 794) | dry etching | $4.0 \times 10^{-10}$ | $4.0 \times 10^{-10}$ | A | 0.60 | 50 |
| Example 2 | Ti3N3.8 | 100 | chemical formula 2 (molecular weight: 360) | dry etching | $4.0 \times 10^{-10}$ | $5.0 \times 10^{-10}$ | A | 0.60 | 50 |
| Example 3 | Ti3N3.8 | 100 | chemical formula 3 (molecular weight: 1400) | dry etching | $4.0 \times 10^{-10}$ | $2.0 \times 10^{-9}$ | C | 0.60 | 50 |
| Example 4 | Ti3N4 | 100 | chemical formula 1 (molecular weight: 794) | dry etching | $5.0 \times 10^{-10}$ | $8.0 \times 10^{-10}$ | B | 0.60 | 50 |
| Example 5 | Ti3N3.8 | 200 | chemical formula 1 (molecular weight: 794) | dry etching | $8.0 \times 10^{-10}$ | $1.0 \times 10^{-9}$ | C | 1.04 | 50 |
| Example 6 | Ti3N3.8 | 100 | chemical formula 1 (molecular weight: 794) | wet etching | $4.0 \times 10^{-10}$ | $6.0 \times 10^{-10}$ | B | 0.60 | 20 |
| Comparative Example 1 | ITO | 100 | chemical formula 1 (molecular weight: 794) | dry etching | $4.0 \times 10^{-10}$ | $1.0 \times 10^{-9}$ | C | 1.07 | 50 |

In Example 1, the organic layer was not separated with Sellotape™, but in Comparative Example 1, the organic layer was completely separated with Sellotape. This reveals that use of titanium nitride for the pixel electrode enables obtaining adherence of the pixel electrode to the organic layer as compared with use of ITO. Also, in Example 1, the increase of dark current due to heating can be greatly reduced as compared with Comparative Example 1. The reason for enhanced adherence is considered because by using titanium nitride for the pixel electrode, flatness is improved and the bonding force to an organic molecule is thereby enhanced as compared with the case of using ITO.

Furthermore, by using titanium nitride for the pixel electrode, the average surface roughness Ra can be made as small as 1.00 nm or less. In the case of ITO pixel electrode, a film having high electrical conductivity can be hardly produced with an average surface roughness Ra of 1.00 nm or less, as a result, the adherence to an organic molecule is reduced. By forming the pixel electrode from titanium nitride, a film having high electrical conductivity can be produced while reducing the average surface roughness Ra to 1.00 nm or less, and enhancement of adherence to an organic molecule can be realized.

In this way, as compared with the conventional case of using a pixel electrode on a glass substrate, the flatness of the pixel electrode is improved and the adherence is enhanced, so that the dark current can be remarkably suppressed. The reasons therefor are as follows. When the pixel electrode has a rough surface, the photoelectric conversion layer and the lower electrode are put into proximity to each other (an electron blocking layer is inserted between the lower electrode and the photoelectric conversion layer, but due to unevenness, the photoelectric conversion layer comes close to the lower electrode), and when a heat treatment is performed in this state, the molecules undergo thermal motion to put the photoelectric conversion layer into more proximity to the lower electrode, as a result, leakage readily occurs and the dark As seen from the results of Examples 1 and 4, when titanium nitride has a composition of 3 mol of Ti atom and 4 mol of N atom, the adherence is decreased and the dark current after heat treatment is increased as compared with a composition of 3 mol of Ti atom and 3.8 mol of N atom.

As seen from the results of Examples 1, 2 and 3 and Comparative Example 1, when the molecular weight of the compound in the organic layer in contact with the pixel electrode is less than 400, Tg lowers and therefore, the dark current after heat treatment is increased. On the other hand, when the molecular weight of the compound in the organic layer is 1,400, adherence is not obtained and therefore, the dark current after heat treatment is increased. For this reason, the molecular weight of the compound in contact with the pixel electrode is more preferably from 400 to 1,300.

As seen from the results of Examples 1 and 5, the adherence is enhanced by adjusting the average surface roughness of the pixel electrode to 1.0 nm or less, and this is more preferred.

Also, when the film thickness is 200 nm as in Example 5, the average surface roughness is increased and the flatness is deteriorated, as a result, the adherence is reduced and separation with tape is generated.

As seen from the results of Examples 1 and 6, when patterning is performed by dry etching and the tilt angle in the edge part of the pixel electrode with respect to the substrate surface is an acute angle, the adherence is enhanced. For this reason, the tilt angle in the end with respect to the substrate surface is more preferably 20° or more.

Next, in order to examine the relationship between the tilt angle in the edge part of the pixel electrode and the adherence, the following measurements were performed.

In Example 1, the measurement was the same as above.

In Examples 8 to 11, in the same manner as in Example 1, an insulating layer containing silicon oxide was formed on a silicon substrate to a film thickness of 200 nm and on the insulating layer, titanium nitride (3.8 mol of N atom per 3 mol of Ti atom) was patterned by dry etching to a thickness of 100 nm to form a pixel electrode. On the pixel electrode, the compound represented by chemical formula 1 (molecular weight: 794) was deposited to a thickness of 100 nm to form an electron blocking layer. Thereafter, the compounds represented by chemical formulae 4, 5 and 6 were co-deposited to a thickness of 400 nm in total to form an organic layer. On the organic layer, ITO as an upper electrode was sputtered to a thickness of 10 nm.

The tilt angle in the edge part of the pixel electrode was set to 5° in Example 8, 10° in Example 9, 70° in Example 10, and 80° in Example 11. The evaluation results are shown in Table 2.

Examples 1 and 4 were the same as above.

In Examples 12 to 14, in the same manner as in Example 1, an insulating layer containing silicon oxide was formed on a silicon substrate to a film thickness of 200 nm and on the insulating layer, titanium nitride (3.8 mol of N atom per 3 mol of Ti atom) was patterned by dry etching to a thickness of 100 nm to form a pixel electrode. On the pixel electrode, the compound represented by chemical formula 1 (molecular weight: 794) was deposited to a thickness of 100 nm to form an electron blocking layer. Thereafter, the compounds represented by chemical formulae 4, 5 and 6 were co-deposited to a thickness of 400 nm in total to form an organic layer. On the organic layer, ITO as an upper electrode was sputtered to a thickness of 10 nm.

TABLE 2

| Sample | Pixel Electrode | Film Thickness (nm) | Organic Layer in Contact with Pixel Electrode | Etching Method of Lower Electrode | Dark Current Before Heating | Dark Current After Heating | Evaluation of Separation | Average Surface Roughness of Pixel Electrode (nm) | Tilt Angle in Edge Part of Pixel Electrode |
|---|---|---|---|---|---|---|---|---|---|
| Example 1 | Ti3N3.8 | 100 | chemical formula 1 (molecular weight: 794) | dry etching | $4.0 \times 10^{-10}$ | $4.0 \times 10^{-10}$ | A | 0.60 | 50 |
| Example 8 | Ti3N3.8 | 100 | Chemical formula 1 (molecular weight: 794) | dry etching | $5.0 \times 10^{-10}$ | $1.0 \times 10^{-9}$ | B | 0.60 | 5 |
| Example 9 | Ti3N3.8 | 100 | Chemical formula 1 (molecular weight: 794) | dry etching | $4.0 \times 10^{-10}$ | $4.0 \times 10^{-10}$ | A | 0.60 | 10 |
| Example 10 | Ti3N3.8 | 100 | Chemical formula 1 (molecular weight: 794) | dry etching | $4.0 \times 10^{-10}$ | $4.0 \times 10^{-10}$ | A | 0.60 | 70 |
| Example 11 | Ti3N3.8 | 100 | Chemical formula 1 (molecular weight: 794) | dry etching | $6.0 \times 10^{-10}$ | $2.0 \times 10^{-9}$ | B | 0.60 | 80 |

In Examples 1, 9 and 10, separation with tape is not observed as compared with Examples 8 and 11, revealing that sufficient adherence can be ensured. Accordingly, it is understood that when the tilt angle is from 10 to 70°, sufficient adhesion can be ensured and when the tilt angle is less than 10° or exceeds 70°, the adherence is decreased more definitely.

Furthermore, in order to examine the relationship between the compositional ratio of titanium nitride and the dark current, the following measurements were performed.

In Example 12, the composition of titanium nitride was adjusted to 3.9 mol of N atom per 3 mol of Ti atom.

In Example 13, the composition of titanium nitride was adjusted to 1.0 mol of N atom per 3 mol of Ti atom.

In Example 14, the composition of titanium nitride was adjusted to 0.8 mol of N atom per 3 mol of Ti atom. The results of measurements are shown in Table 3.

TABLE 3

| Sample | Pixel Electrode | Film Thickness (nm) | Organic Layer in Contact with Pixel Electrode | Etching Method of Lower Electrode | Dark Current Before Heating | Dark Current After Heating |
|---|---|---|---|---|---|---|
| Example 1 | Ti3N3.8 | 100 | chemical formula 1 (molecular weight: 794) | dry etching | $4.0 \times 10^{-10}$ | $4.0 \times 10^{-10}$ |
| Example 4 | Ti3N4 | 100 | chemical formula 1 (molecular weight: 794) | dry etching | $5.0 \times 10^{-10}$ | $8.0 \times 10^{-10}$ |
| Example 12 | Ti3N3.9 | 100 | chemical formula 1 (molecular weight: 794) | dry etching | $4.5 \times 10^{-10}$ | $4.5 \times 10^{-10}$ |
| Example 13 | Ti3N1.0 | 100 | chemical formula 1 (molecular weight: 794) | dry etching | $4.8 \times 10^{-10}$ | $4.8 \times 10^{-10}$ |
| Example 14 | Ti3N0.8 | 100 | chemical formula 1 (molecular weight: 794) | dry etching | $6.0 \times 10^{-10}$ | $1.0 \times 10^{-9}$ |

As seen from these results, the composition of titanium nitride is preferably 3.9 mol or less of N atom per 3 mol of Ti atom. It is understood that when the composition of titanium nitride is adjusted to from 1.0 to 3.9 mol of N atom per 3 mol of Ti atom, the dark current can be more unfailingly reduced.

One configuration example of the imaging device equipped with a photoelectric conversion element is described.

In the configuration example described below, the members and the like having the same configurations or operations as the members described above are indicated by the same numerals or like numerals in the Figure, and their description is simplified or omitted.

Figure 7:
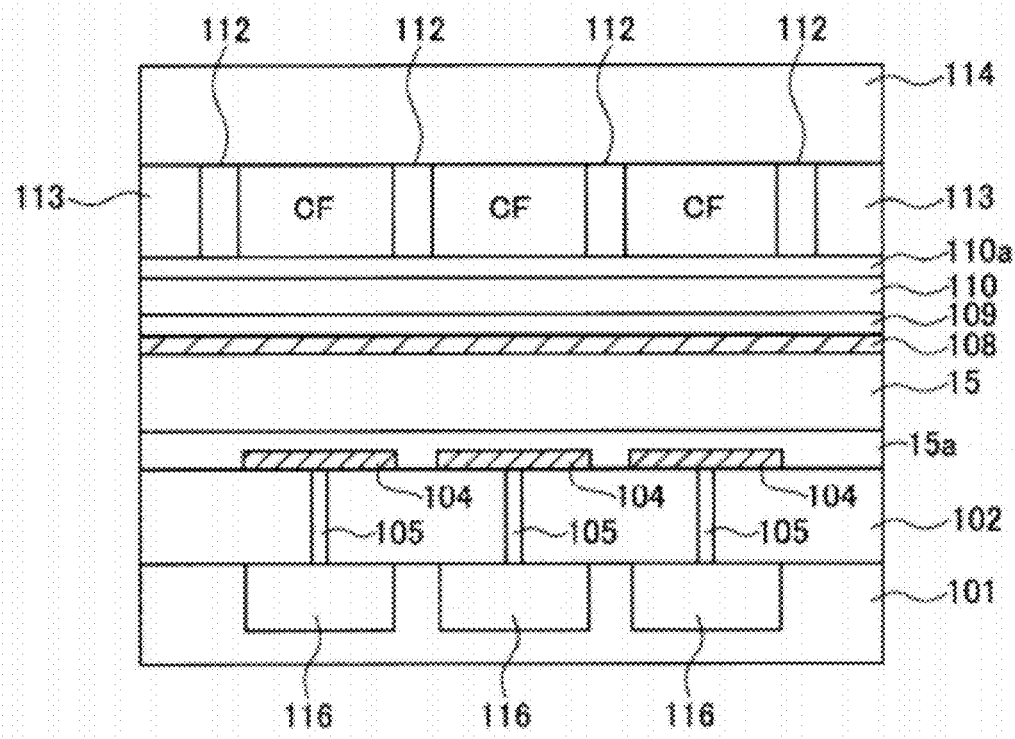
FIG. 7 is a schematic cross-sectional view showing a configuration example of the imaging device.

FIG. 7 is a schematic cross-sectional view showing a configuration example of the imaging device. The imaging device has a plurality of pixel parts. The plurality of pixel parts are two-dimensionally arranged in planar view of the silicon substrate 101 from the light incident side. The pixel part contains at least a pixel electrode 104 composed of titanium nitride, an organic layer containing a photoelectric conversion layer 15 and a charge blocking layer 15a, a counter electrode 108 facing the pixel electrode 104, a passivation layer 110, a color filter CF, a partition 112, and a reading circuit 116.

In the imaging device of this configuration example, a pixel electrode 104 is provided on the surface of the insulating layer 102, and a charge blocking layer 15a is provided to cover the insulating layer 102 and the pixel electrode 104. The chare blocking layer 15a has a function of preventing injection of an electron into the photoelectric conversion layer 15 from the pixel electrode 104. In this configuration example, the potential of the counter electrode 108 is made higher than the potential of the reading circuit 116 to allow the current to flow from the counter electrode 108 toward the pixel electrode 104 (that is, a hole is trapped in the pixel electrode 104).

The reading circuit 116 can be configured to include, for example, a floating diffusion (FD), a reset transistor, an output transistor, a selection transistor and a protective transistor for limiting the potential of FD, and these members each is composed of an nMOS transistor. The reading circuit 116, the interconnection layer including a via plug 105, the insulating layer 102 and the pixel electrode 104 in the Figure were produced by a standard CMOS image sensor process. The pixel electrode 104 was formed by depositing titanium nitride by a CVD method (film thickness: 30 nm), and the surface roughness Ra was 0.4. The dry etching process of titanium nitride was performed under isotropic plasma etching conditions, whereby the titanium nitride was patterned such that the edge part of the pixel electrode 104 is tilted at a tilt angle of 50° from the substrate surface. Incidentally, the tilt angle in the edge part was here 50° with respect to the substrate surface, but patterning needs not be necessarily performed to tilt the edge part at 50°.

The charge blocking layer 15a was formed by depositing the compound of chemical formula 1 to a film thickness of 100 nm. Also, the compounds of formulae 2, 3 and 4 were deposited to form the photoelectric conversion layer 15 with a film thickness of 400 nm. Here, when the charge blocking layer 15a has a single-layer structure, the difference between the electron affinity Ea of the n-type organic semiconductor contained in the photoelectric conversion layer 15 and the ionization potential Ip of the charge blocking layer 15a adjacent to the photoelectric conversion layer 15 is designated as Δ1. Also, the difference between the electron affinity Ea of the charge blocking layer 15a and the work function of the counter electrode 108 adjacent to the charge blocking layer 15a is designated as Δ2. The electron affinity of $C_{60}$ contained in the photoelectric conversion layer 15 was Ea=4.2 eV, the ionization potential of chemical formula 1 working out to the charge blocking layer 15a was Ip=5.2 eV, and in turn, Δ1=1.0 eV, so that in the photoelectric conversion element of this configuration, the dark current could be effectively suppressed. Furthermore, the electron affinity of chemical formula 1 working out to the charge blocking layer 15a was Ea=1.9 eV, the work function of titanium nitride working out to the pixel electrode 104 was 4.6 eV, and in turn, Δ2=2.7 eV, so that in the photoelectric conversion element of this configuration, injection of an electron into the photoelectric conversion layer 15 from the pixel electrode 104 could be prevented. In the process of depositing these layers, the degree of vacuum was $1 \times 10^{-4}$ Pa or less, and the charge blocking layer 15a and the photoelectric conversion layer 15 were formed by disposing a first metal mask above the substrate. In this configuration example, the potential of the counter electrode 108 is made high to allow the current to flow from the counter electrode 108 toward the pixel electrode 104 (that is, a hole is trapped in the pixel electrode 104).

ITO was formed as the counter electrode 108 to a film thickness of 10 nm by high-frequency magnetron sputtering using an ITO target in an atmosphere having a degree of vacuum of 0.1 Pa into which an Ar gas and an $O_2$ gas were introduced. The counter electrode was formed by disposing a second metal mask above the substrate.

Silicon monoxide was vacuum deposited as a buffer layer 109 to a film thickness of 100 nm. In this vapor deposition process, the degree of vacuum was set to $1 \times 10^{-4}$ Pa or less, and the buffer layer 109 was formed on the counter electrode 108 by disposing a third metal mask above the substrate. The buffer layer 109 has a role in adsorbing and/or reacting a factor that invades through microdefects of the passivation layer 110, whose generation can be hardly made nil due to dusts or the like in the production process, and that deteriorates the organic photoelectric conversion material such as water molecule, and thereby blocking the deterioration factor from reaching the organic photoelectric conversion material below the passivation layer.

An organic EL production apparatus where a vacuum deposition apparatus for deposing the charge blocking layer 15a, the photoelectric conversion layer 15, the counter electrode 108 and the buffer layer 109 and a sputtering apparatus for depositing the counter electrode 108 each is directly connected to a cluster-type vacuum transport system at a degree of vacuum of $1 \times 10^{-4}$ Pa or less, was used.

The passivation layer 110 is formed from 0.2 μm-thick aluminum oxide in an atomic layer deposition apparatus by using trimethylaluminum and water and using Ar as the carrier gas at a substrate temperature of 150° C. or less in an atmosphere having a degree of vacuum of 0.5 kPa.

On the passivation layer 110, an auxiliary passivation layer 110a composed of 0.1 μm-thick silicon nitride was formed. The auxiliary passivation layer 110a protects the passivation layer. The auxiliary passivation layer 110a was formed by high-frequency magnetron sputtering using a silicon nitride target in an atmosphere having a degree of vacuum of 0.1 Pa into which an Ar gas and an $N_2$ gas were introduced.

On the auxiliary passivation layer 110a, a layer containing a color filter CF, a partition 112 and a light-shielding layer 113 was provided, and on this layer, an overcoat layer 114 was provided.

The partition 112 has a function of separating color filters CF from each other and efficiently gathering the incident light into the photoelectric conversion layer 15. The light-shielding layer 113 has a function of shielding against incident light for the peripheral region excluding the effective pixel region having an array of pixel electrodes 104 in planar view of the substrate 101.

According to the imaging device of this configuration example, the adherence between the pixel electrode 104 and the organic layer is enhanced. Also, the heat resistance of the pixel electrode 104 is satisifed, and the increase of dark current can be suppressed.

In the description above, the following matters are disclosed.

(1) A photoelectric conversion element comprising, in the following order, a substrate, a lower electrode, an organic layer containing a photoelectric conversion layer, and an upper electrode containing a transparent electrode material, wherein the lower electrode contains titanium nitride.

(2) The photoelectric conversion element as described in (1), wherein the content of titanium nitride in the lower electrode is 70% by weight or more.

(3) The photoelectric conversion element as described in (1) or (2), wherein the content of titanium oxide in the lower electrode is 10% by weight or less.

(4) The photoelectric conversion element as described in any one of (1) to (3), wherein the compositional ratio of titanium nitride in the lower electrode is from 1 to 3.9 mol of N atom per 3 mol of Ti atom.

(5) The photoelectric conversion element as described in any one of (1) to (4), wherein the work function of titanium nitride in the lower electrode is 4.6 eV or more.

(6) The photoelectric conversion element as described in any one of (1) to (5), wherein the lower electrode is formed by a CVD method.

(7) The photoelectric conversion element as described in any one of (1) to (6), wherein the lower electrode is pixel electrodes divided for each pixel.

(8) The photoelectric conversion element as described in (7), wherein the pixel electrode has a square shape in planar view and the length of one side is 3 μm or less.

(9) The photoelectric conversion element as described in (7) or (8), wherein the thickness of the pixel electrode is 100 nm or less.

(10) The photoelectric conversion element as described in (7) or (8), wherein the thickness of the pixel electrode is 30 nm or less.

(11) The photoelectric conversion element as described in any one of (7) to (10), wherein the average surface roughness of the pixel electrode is 1 nm or less.

(12) The photoelectric conversion element as described in any one of (7) to (11), wherein the tilt angle in the edge part of the pixel electrode is from 10 to 70° with respect to the substrate surface.

(13) The photoelectric conversion element as described in any one of (7) to (12), wherein patterning of the pixel electrode is formed by dry etching.

(14) The photoelectric conversion element as described in any one of (1) to (13), wherein an insulating layer is formed between the substrate and the lower electrode and the substrate contains single-crystal silicon.

(15) The photoelectric conversion element as described in (14), wherein the insulating layer contains silicon oxide.

(16) The photoelectric conversion element as described in (14), wherein the insulating layer contains silicon nitride.

(17) The photoelectric conversion element as described in any one of (1) to (16), wherein the thickness of the organic layer is 1 μm or less.

(18) The photoelectric conversion element as described in any one of (1) to (17), wherein the molecular weight of the organic compound in the organic layer is from 400 to 1,300.

(19) The photoelectric conversion element as described in any one of (1) to (18), wherein the upper electrode contains a transparent electrically conductive oxide.

(20) The photoelectric conversion element as described in any one of (1) to (19), wherein the thickness of the upper electrode is from 3 to 100 nm.

(21) The photoelectric conversion element as described in any one of (1) to (20), wherein the upper electrode is formed by a sputtering method.

(22) The photoelectric conversion element as described in any one of (1) to (21), wherein the upper electrode is ITO.

(23) An imaging device comprising the photoelectric conversion element described in any one of (1) to (22), wherein an electric charge accumulating part for accumulating an electric charge generated in the photoelectric conversion layer and a connection part for transmitting an electric charge of the photoelectric conversion layer to the electric charge accumulating part are provided.

The photoelectric conversion element and the imaging device described in the foregoing pages can be used in a digital still camera, an endoscope with imaging apparatus, a mobile terminal, and the like, and can also be utilized for an imaging apparatus such as monitoring camera and on-vehicle camera.

What is claimed is:

1. A photoelectric conversion element comprising:
a substrate;
a plurality of pixel electrodes divided for each pixel;
an organic layer including a photoelectric conversion layer; and
an upper electrode including a transparent electrode material,
wherein the organic layer includes an organic compound having a molecular weight of from 400 to 1,300,
each of the pixel electrode includes titanium nitride and has a thickness of 100 nm or less,
a compositional ratio of the titanium nitride in the pixel electrode is from 1 to 3.9 mol of N atom per 3 mol of Ti atom, and
a tilt angle in an edge part of the pixel electrode is from 10 to 70° with respect to a surface of the substrate.

2. The photoelectric conversion element as claimed in claim 1, wherein the pixel electrode includes 70% by weight or more of the titanium nitride.

3. The photoelectric conversion element as claimed in claim 1, wherein lower electrode includes 10% by weight or less of titanium oxide.

4. The photoelectric conversion element as claimed in claim 1, wherein a work function of the titanium nitride in the lower electrode is 4.6 eV or more.

5. The photoelectric conversion element as claimed in claim 1, wherein the lower electrode is formed by a CVD method.

6. The photoelectric conversion element as claimed in claim 1, wherein the pixel electrode has a square shape in planar view and a length of one side of the pixel electrode is 3 μm or less.

7. The photoelectric conversion element as claimed in claim 1, wherein the pixel electrode has a thickness of 30 nm or less.

8. The photoelectric conversion element as claimed in claim 1, wherein the pixel electrode has an average surface roughness of 1 nm or less.

9. The photoelectric conversion element as claimed in claim 1, wherein patterning of the pixel electrode is formed by dry etching.

10. The photoelectric conversion element as claimed in claim 1, which further includes an insulating layer between the substrate and the lower electrode, wherein the substrate comprises single-crystal silicon.

11. The photoelectric conversion element as claimed in claim 10, wherein the insulating layer includes silicon oxide.

12. The photoelectric conversion element as claimed in claim 10, wherein the insulating layer includes silicon nitride.

13. The photoelectric conversion element as claimed in claim 1, wherein the organic layer has a thickness of 1 μm or less.

14. The photoelectric conversion element as claimed in claim 1, wherein the upper electrode includes a transparent electrically conductive oxide.

15. The photoelectric conversion element as claimed in claim 1, wherein the upper electrode has a thickness of from 3 to 100 nm.

16. The photoelectric conversion element as claimed in claim 1, wherein the upper electrode is formed by a sputtering method.

17. The photoelectric conversion element as claimed in claim 1, wherein the upper electrode is formed from ITO.

18. An imaging device comprising the photoelectric conversion element claimed in claim 1, wherein the imaging device further comprises:
   an electric charge accumulating part for accumulating an electric charge generated in the photoelectric conversion layer; and
   a connection part for transmitting an electric charge of the photoelectric conversion layer to the electric charge accumulating part.

* * * * *